(12) United States Patent
Chang

(10) Patent No.: US 10,528,313 B2
(45) Date of Patent: Jan. 7, 2020

(54) DISPLAY DEVICE

(71) Applicant: LG Display Co., Ltd., Seoul (KR)

(72) Inventor: KukHui Chang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/835,799

(22) Filed: Dec. 8, 2017

(65) Prior Publication Data

US 2018/0181357 A1    Jun. 28, 2018

(30) Foreign Application Priority Data

Dec. 22, 2016    (KR) .................. 10-2016-0176592

(51) Int. Cl.
| | |
|---|---|
| *G09G 3/20* | (2006.01) |
| *G06F 3/14* | (2006.01) |
| *G09G 3/36* | (2006.01) |
| *H01L 27/32* | (2006.01) |
| *G06F 3/147* | (2006.01) |

(52) U.S. Cl.
CPC ......... *G06F 3/1423* (2013.01); *G09G 3/2092* (2013.01); *G09G 3/3633* (2013.01); *G06F 3/1475* (2013.01); *G09G 2330/021* (2013.01); *H01L 27/3276* (2013.01)

(58) Field of Classification Search
CPC ............... G09G 3/3633; G09G 3/2092; G09G 2370/08; G09G 3/2096; G09G 2370/12; G09G 5/006; G09G 2320/0693
See application file for complete search history.

(56) References Cited

U.S. PATENT DOCUMENTS

| | | | |
|---|---|---|---|
| 2010/0289781 A1 | 11/2010 | Kim et al. | |
| 2014/0016034 A1* | 1/2014 | Cirstea | .................. H04N 7/108 |
| | | | 348/460 |
| 2016/0241422 A1* | 8/2016 | Akita | ....................... H04B 3/10 |

FOREIGN PATENT DOCUMENTS

| | | |
|---|---|---|
| KR | 10-2010-0123138 A | 11/2010 |
| KR | 10-1658107 B1 | 9/2016 |

OTHER PUBLICATIONS

"Video/Display", Diodes Incorporated, https://www.pericom.com/protocols/videodisplay/.

* cited by examiner

*Primary Examiner* — Dennis P Joseph
(74) *Attorney, Agent, or Firm* — Morgan, Lewis & Bockius LLP

(57) ABSTRACT

A display device includes a display unit, a driving unit, a control board, and at least one recovery unit. The display unit includes a plurality of pixels. The driving unit provides a driving signal to the display unit. The control board is spaced apart from the driving unit and outputs the output signal in a serial link manner. At least one recovery unit is located between the driving unit and the control board and is spaced apart from the driving unit and the control board, and is configured to recover the output signal.

14 Claims, 8 Drawing Sheets

DISPLAY DEVICE

CROSS-REFERENCE TO RELATED APPLICATIONS

This application claims the priority of Korean Patent Application No. 10-2016-0176592 filed on Dec. 22, 2016, in the Korean Intellectual Property Office, the disclosure of which is incorporated herein by reference.

BACKGROUND

Technical Field

The present disclosure relates to a display device and more particularly, to a display device which is capable of transmitting data even though a distance between components is large.

Description of the Related Art

Various flat panel display devices which may reduce a weight and a volume which are disadvantages of a cathode ray tube are emerging. Such a flat panel display device includes a liquid crystal display LCD, an organic light emitting diode OLED display device, a plasma display panel PDP, and the like.

Such a display device includes a display unit including a plurality of pixels, a driving board which drives the display unit, a control board which controls the driving board, and a system board which transmits image data. The control board receives image data from the system board and converts the image data in accordance with a data signal format which can be processed by the driving unit of the driving board to generate output image data, and then converts the output image data according to a standardized interface to output an output signal.

As the standardized interface, low-voltage differential signaling LVDS, reduced swing differential signaling RSDS, a mobile display digital interface MDDI, a high definition multimedia interface HDMI, or a display port DP may be used. The interfaces transmit the output signal in a serial link manner so that various data may be transmitted by a reduced number of wiring lines. In the serial link manner, a smaller number of wiring lines than a parallel link is used. Therefore, there are advantages in that electromagnetic interference between wiring lines may be reduced and a manufacturing cost of the display device may be saved.

In the meantime, when the distance between the control board and the driving board is long, noises may be considerably generated from a cable which connects between the control board and the driving board. For example, a noise may be generated due to IR drop by the resistance of the cable and cross talk between the wiring lines of the cable, which modifies a waveform of an output signal output from the control board. Specifically, a serial link interface transmits data as a high frequency signal so that the serial link interface is susceptible to the noise. When the noise is generated to modify the waveform of the output signal, data included in the output signal is erroneously recognized to degrade an image quality of the display device. Therefore, there is a limitation to sufficiently spacing the distance between the control board and the driving board. Therefore, it is required to develop a technology which transmits the output signal without modifying the output signal even though the distance between the control board and the driving board is long.

SUMMARY

Accordingly, embodiments of the present disclosure are directed to a display device that substantially obviates one or more of the problems due to limitations and disadvantages of the related art.

An object to be achieved by the present disclosure is to provide a display device which may minimize modification of a signal even though a distance between the control board and the driving unit is long.

Another object to be achieved by the present disclosure is to provide a display device which may minimize modification of a signal even though a distance between the system board and the control board is long.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a display device comprises: a display unit, a driving unit, a control board, and at least one recovery unit. The display unit includes a plurality of pixels. The driving unit provides a driving signal to the display unit. The control board is spaced apart from the driving unit and outputs the output signal in a serial link manner. At least one recovery unit is located between the driving unit and the control board, is spaced apart from the driving unit and the control board and is configured to recover the output signal. The display device according to an exemplary embodiment of the present disclosure recovers the output signal of the control board between the control board and the driving unit using at least one recovery unit. Therefore, it is possible to transmit the output signal of the control board over a long distance and transmit the output signal of the control board without having a loss of data even though the distance between the control board and the driving unit is long.

In another aspect, a display device comprises a display unit, a source board, a control board, and a cable assembly. The display unit includes a plurality of pixels. The source board provides a driving signal to the display unit. The control board is spaced apart from the source board and outputs the output signal in a serial link manner. The cable assembly is configured to connect the source board and the control board, to recover the output signal between the source board and the control board to generate a recovery signal, and transmit the recovery signal to the source board.

Other detailed matters of the exemplary embodiments are included in the detailed description and the drawings.

According to the aspect of the present disclosure, a recovery unit which is located between the control board and the driving board and is spaced apart from the control board and the driving board is used to recover an output signal output from the control board. Therefore, the output signal of the control board can be transmitted over a long distance and the control board and the driving unit can be spaced apart from each other with a sufficient distance.

Further, according to another aspect of the present disclosure, an input recovery unit which is located between the system board and the control board and is spaced apart from the system board and the control board is used to recover an input signal output from the system board. Therefore, the system board and the control board can be sufficiently spaced apart from each other and a degree of freedom in a design of the display device may be improved.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Figure 1:
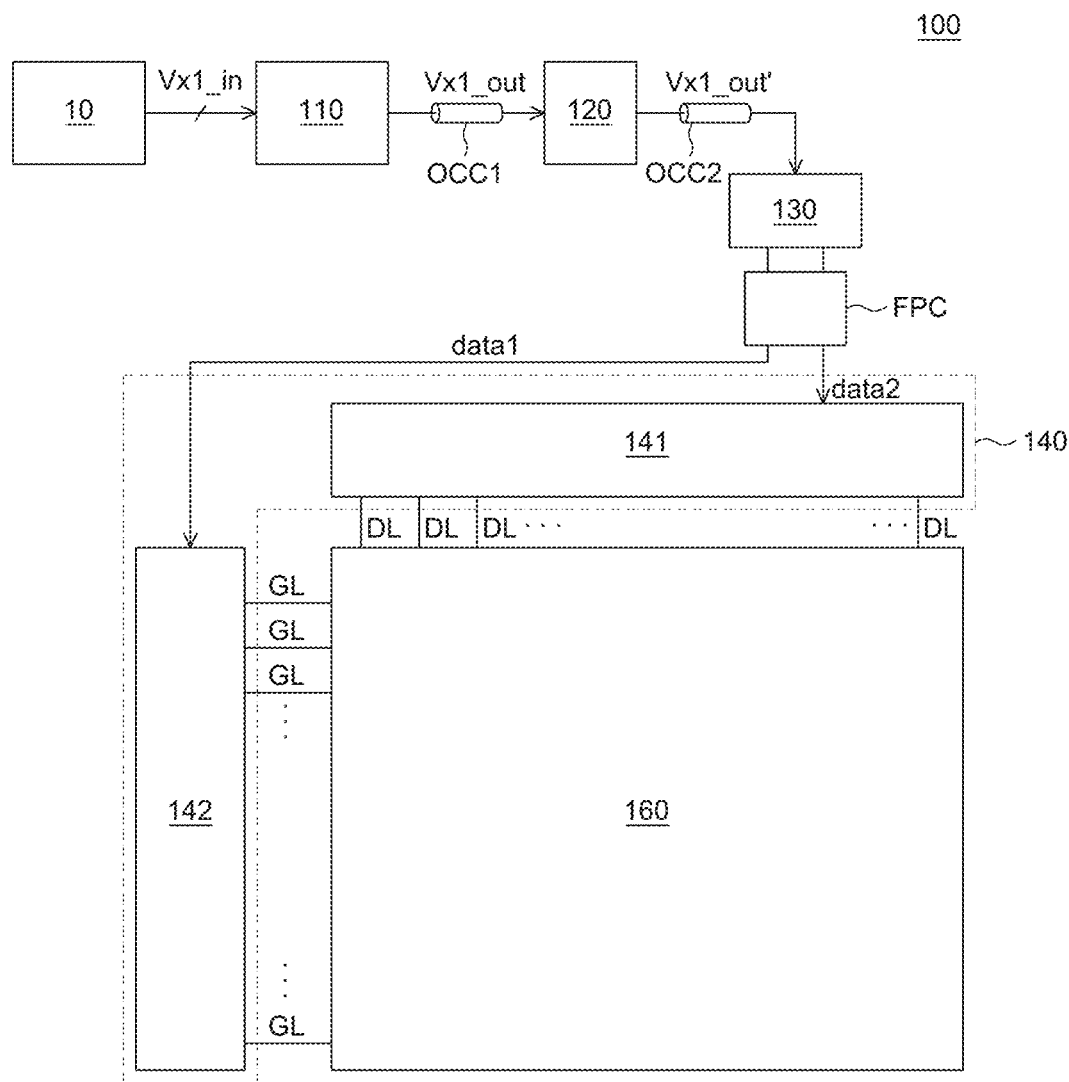
FIG. 1 is a schematic block diagram of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to exemplary embodiment disclosed herein but will be implemented in various forms. The exemplary embodiments are provided by way of example only so that a person of ordinary skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next to", one or more parts may be positioned between the two parts unless the terms are used with the term "immediately" or "directly" is not used.

When an element or layer is disposed "on" other element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely bonded to or combined with each other and can be interlocked and operated in technically various ways as understood by those skilled in the art, and the embodiments can be carried out independently of or in association with each other.

Hereinafter, various exemplary embodiments of the present disclosure will be described in detail with reference to accompanying drawings.

Figure 2:
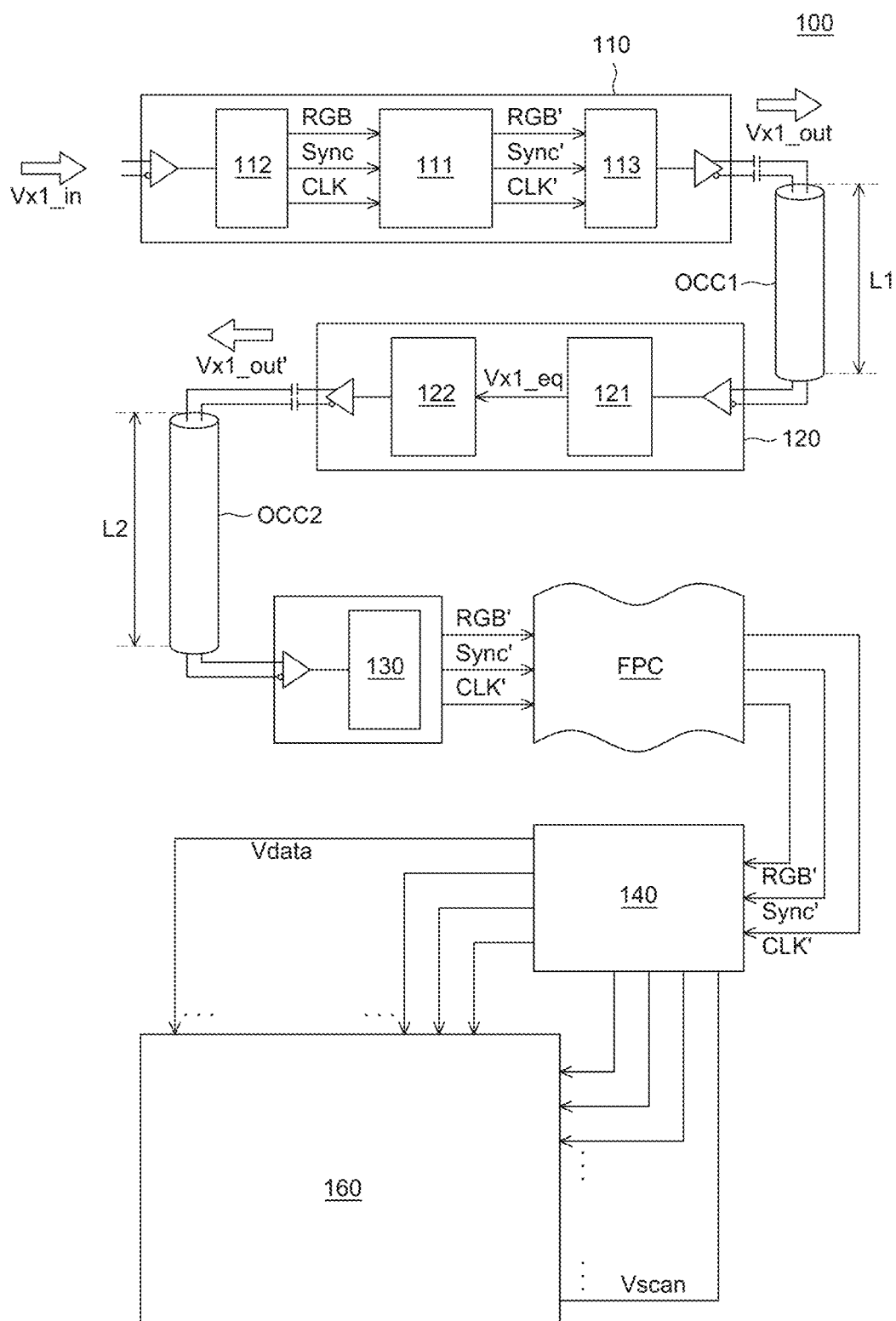
FIG. 2 is a block diagram schematically illustrating a signal flow of a display device according to an exemplary embodiment of the present disclosure.

FIG. 1 is a schematic block diagram of a display device according to an exemplary embodiment of the present disclosure. FIG. 2 is a block diagram schematically illustrating a signal flow of a display device according to an exemplary embodiment of the present disclosure. Referring to FIGS. 1 and 2, a display device 100 includes a display unit 160, a control board 110, a recovery unit 120, an intermediate interface 130, and a driving unit 140.

The display unit 160 includes a substrate, data lines DL and gate lines GL extending on the substrate, and a plurality of pixels disposed on the substrate. Each pixel includes a plurality of sub pixels and each of the sub pixels is disposed in a region defined when the data lines DL and the gate lines GL intersect each other. Sub pixels are disposed in a row direction and a column direction to be disposed in a matrix form.

The control board 110 receives an input signal Vx1_in from the system board 10 and outputs an output signal Vx1_out. The control board 110 includes a timing controller 111, a receiving unit 112, and a transmitting unit 113.

The receiving unit 112 receives the input signal Vx1_in from the system board 10. The input signal Vx1_in is a signal transmitted in a serial link manner and includes various data. The receiving unit 112 converts the input signal Vx1_in into a parallel signal using a specific type of interface. Here, the specific type of interface may be V-by-One interface.

The V-by-One interface is an image data transmitting interface which is developed by THine Electronics, Inc. The V-by-One interface may transmit data at a data transmission rate of up to 3.75 Gbps and use a clock data recovery function without transmitting a separate clock signal, so that a skew problem caused in clock transmission is not generated. Further, since the V-by-One interface does not perform clock transmission, when a clock is transmitted, a noise generated due to electromagnetic interference EMI is desirably reduced.

The receiving unit 112 converts the input signal Vx1_in using the V-by-One interface to generate input image data RGB, an input control signal Sync, and an input clock signal CLK. Here, the input image data RGB refers to image data for each sub pixel of the display unit 160 and includes various timing signals such as a vertical synchronization signal Vsync, a horizontal synchronization signal Hsync, and a data enable signal DE. Further, since the input signal Vx1_in is a signal in which a clock signal is embedded, the receiving unit 112 may recover the input clock signal CLK from the input signal Vx1_in using a CDR circuit.

In some exemplary embodiments, the receiving unit 112 may be configured to perform equalizing to remove a noise of the input signal Vx1_in before converting the input signal Vx1_in transmitted in a serial link manner into a parallel signal.

The timing controller 111 converts the input image data RGB in accordance with a data signal format which is capable of being processed in the driving unit 140 so that output image data RGB' is output.

Further, the timing controller 111 outputs the output control signal Sync' based on the input control signal Sync. The output control signal Sync' is a signal for controlling an operation of the driving unit 140 according to an appropriate scan timing and includes a start pulse and an output enable signal. For example, the output control signal Sync' may include a source start pulse SSP and a source output enable signal SOE for controlling a data driving unit 141 of the driving unit 140. Further, the output control signal Sync' may include a gate start pulse GSP and a gate output enable signal GOE for controlling a gate driving unit 142 of the driving unit 140.

Here, the source start pulse controls a data sampling start timing of one or more data circuits which configure the data driving unit 141. The source output enable signal controls the output timing of the data driving unit 141. Further, the gate start pulse controls an operation start timing of one or more gate circuits which configure the gate driving unit 142. The gate output enable signal designates timing information of one or more gate circuits.

Further, the timing controller 111 converts the input clock signal CLK to output an output clock signal CLK'. The output clock signal CLK' is a clock signal which is provided to the driving unit 140. For example, the output clock signal CLK' includes a source sampling clock SSC provided to the data driving unit 141 and a gate shift clock GSC provided to the gate driving unit 142.

Here, the source sampling clock is a clock signal which controls a sampling timing of data in each of data circuits which configure the data driving unit 141. The gate shift clock is a clock signal which is commonly input to the gate circuit which configures the gate driving unit 142 and controls a shift timing of the gate signal (gate voltage pulse).

The transmitting unit 113 converts the output image data RGB', the output control signal Sync', and the output clock signal CLK' output from the timing controller 111 into a serial link type output signal Vx1_out. For example, the transmitting unit 113 converts the data into the serial link type output signal Vx1_output using the V-by-One interface. The V-by-One interface does not transmit a separate output clock signal CLK' and the output clock signal CLK' is embedded in the output signal Vx1_out to be output. Therefore, the skew problem of the output clock signal CLK' is not generated and the EMI noise generated when the output clock signal CLK' is separately transmitted may be reduced.

In some exemplary embodiments, the transmitting unit 113 may be configured to perform pre-emphasis before outputting the output signal Vx1_out. The pre-emphasis adjusts a signal level of a specific bit of the output signal Vx1_out. For example, an amplitude of a period corresponding to a specific bit of a waveform of the output signal Vx1_out may be amplified or reduced by the pre-emphasis. When the output signal Vx1_out on which the pre-emphasis is performed is received by the receiving unit 121 of the recovery unit 120, the output signal Vx1_out may have a similar waveform to a waveform of the first output signal Vx1_out.

Further, in FIG. 2 even though the receiving unit 112, the timing controller 111, and the transmitting unit 113 are illustrated as separated configurations, some configurations of the receiving unit 112, the timing controller 111, and the transmitting unit 113 may be configured as one integrated circuit IC. For example, the receiving unit 112, the timing controller 111, and the transmitting unit 113 may be configured as one IC.

In the meantime, a power controller which supplies various voltages or currents to the display unit 160 and the driving unit 140 or controls various voltages or currents to be supplied may be further disposed in the control board 110. The power controller is also referred to as a power management IC PMIC. In this case, signals output from the power management IC may be transmitted through a first output coaxial cable OCC1 which transmits the output signal Vx1_out or transmitted to the driving unit 140 or the display unit 160 through a separate cable which is separated from the first output coaxial cable OCC1.

The first output coaxial cable OCC1 is a cable which connects the control board 110 and the recovery unit 120 and transmits the output signal Vx1_out of the control board 110 to the recovery unit 120. The first output coaxial cable OCC1 includes a bundle of wiring line pairs configured by two wiring lines. The bundle of wiring line pairs of the first output coaxial cable OCC1 may be formed of a low resistance metal such as copper (Cu) or silver (Ag) and the wiring line pairs are surrounded by insulators to be insulated from each other.

The transmitting unit 113 of the control board 110 provides a differential current having different current amounts in the wiring line pairs using a current mode logic CML. The differential current signals which flow through the wiring line pair may correspond to the output signal Vx1_out. The transmitting unit 113 distributes and provides the output signal Vx1_out to the plurality of wiring line pairs of the first output coaxial cable OCC1. For example, the transmitting unit 113 distributes the output signal Vx1_out including 24 bits of output image data RGB' and 3 bits of output control signal Sync' such that 9 bits of data is transmitted to three wiring line pairs.

The recovery unit 120 is connected to the first output coaxial cable OCC1 and recovers the signals of the output signal Vx1_out to output a recovery output signal Vx1_out'. The recovery unit 120 is physically spaced apart from the control board 110. That is, the recovery unit 120 is not disposed on the control board 110 and is formed on a separate printed circuit board PCB which is spaced apart from the control board 110. The recovery unit 120 includes an equalizer 121 and a pre-emphasis circuit 122.

The equalizer 121 is configured to remove a noise component generated when the output signal Vx1_out transmitted through the first output coaxial cable OCC1 passes through the first output coaxial cable OCC1. Even though the first output coaxial cable OCC1 includes the wiring line pairs formed of a low resistance metal, when a length L1 of the first output coaxial cable OCC1 is long, a noise may be generated in the signal which passes through the first output coaxial cable OCC1. For example, IR drop may be generated due to resistance of the wiring line pair of the first output coaxial cable OCC1 and jitter and inter symbol interference ISI may be generated due to high speed data transmission. The equalizer 121 applies a filter to the output signal Vx1_out which is transmitted through the first output coaxial cable OCC1 to filter the noise component from the output signal Vx1_out. Further, the equalizer 121 uses current sources and switches for a signal from which the noise is removed to recover a signal level of a specific bit whose signal level is lowered.

The pre-emphasis circuit 122 is configured to pre-emphasize a signal Vx1_eq in which the noise is removed and the signal level is recovered by the equalizer 121. Specifically, the pre-emphasis circuit 122 adjusts a signal level of a specific bit according to transition of the signal level. This will be described in more detail with reference to FIG. 3.

Figure 3:
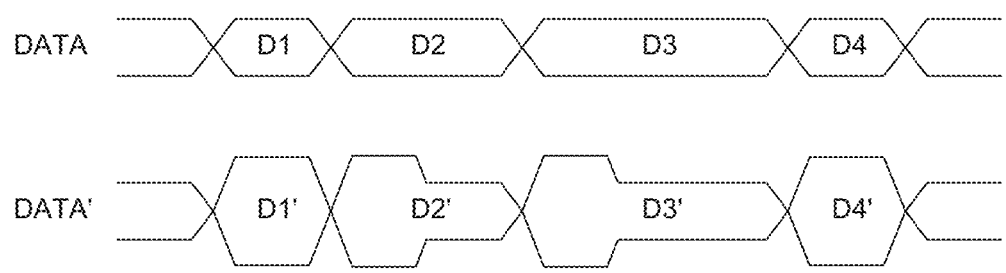
FIG. 3 is a schematic signal waveform diagram for explaining a method of recovering an output signal in a recovery unit of a display device according to an exemplary embodiment of the present disclosure.

FIG. 3 is a schematic signal waveform diagram for explaining a method of recovering an output signal in a recovery unit of a display device according to an exemplary embodiment of the present disclosure. In FIG. 3, a signal which is input to the pre-emphasis circuit 122 is denoted by DATA and a signal which is output through the pre-emphasis circuit 122 is denoted by DATA'.

Referring to FIG. 3, the input signal DATA, for example, may include waveforms corresponding to first data D1, second data D2, and third data D3. In this case, transition of a signal level is generated between the first data D1 and the second data D2, transition of a signal level is generated between the second data D2 and the third data D3, and transition of a signal level is generated between the third data D3 and the fourth data D4. The pre-emphasis circuit 122 may increase or decrease a signal level of a specific bit from a point when the transition of the input signal DATA is generated. In this case, the pre-emphasis circuit 122 is configured by a plurality of current sources and a plurality of switches and applies a current of the current sources to the input signal DATA during a specific period from a point when the transition is generated. In this case, the waveform of the input signal DATA is amplified or decreased during a specific period to generate the output signal DATA'. The pre-emphasized output signal DATA' has a signal level which is amplified or decreased from a specific bit. Therefore, even though the signal waveform is modified through a second output coaxial cable OCC2, the waveform of the signal received through the second output coaxial cable OCC2 may be similar to a waveform of an original signal. That is, the pre-emphasis circuit 122 previously predicts modification of the signal waveform generated by various interferences and intentionally modifies the signal waveform before outputting the signal waveform such that the modified signal waveform is similar to an original signal waveform.

In the meantime, as mentioned above, the display device 100 according to an exemplary embodiment of the present disclosure uses the differential current signal output using the current mode logic as an output signal Vx1_out. Therefore, the pre-emphasis circuit 122 of the recovery unit 120 may generate a recovery signal Vx1_out' which is advantageous for long-distance transmission. Specifically, an interface, such as a low voltage differential signaling LVDS interface which uses a voltage mode logic VML, outputs a differential voltage signal having a low voltage amplitude of 100 mV to 300 mV. As mentioned above, the pre-emphasis circuit 122 previously predicts modification of the output signal Vx1_out to amplify or decrease the output signal Vx1_out before outputting the output signal. However, in the case of the LVDS interface, a peak-to-peak width of the differential voltage signal is limited to mV level so that a margin of the voltage signal which may be amplified or decreased by the pre-emphasis circuit 122 is limited to a small range. In contrast, in the case of an interface which uses a current mode logic, such as a V-by-One interface, the peak-to-peak margin is higher than that of the LVDS interface. Therefore, it is possible to significantly amplify or decrease the current signal by the pre-emphasis circuit 122 and more easily deal with the modification of the signal waveform due to the long distance transmission.

As illustrated in FIGS. 1 and 2, the recovered signal Vx1_out' which is recovered by the recovery unit 120 is transmitted to the intermediate interface 130 through the second output coaxial cable OCC2. The second output coaxial cable OCC2 may be configured by the same cable as the first output coaxial cable OCC1.

The intermediate interface 130 is connected to the second output coaxial cable OCC2 and is configured to convert the recovery signal Vx1_out' received from the second output coaxial cable OCC2 into a parallel signal. The intermediate interface 130 may be configured by the same interface circuits as the receiving unit 112 of the control board 110. Specifically, the intermediate interface 130 uses the V-by-One interface to convert the recovery signal Vx1_out' into output image data RGB', an output control signal Sync', and an output clock signal CLK'.

As mentioned above, the recovery signal Vx1_out' corresponds to a signal obtained by equalizing and pre-emphasizing the output signal Vx1_out of the control board 110. Therefore, the recovery signal Vx1_out' received through the intermediate interface 130 may have a similar waveform to the output signal Vx1_out output from the control board 110. Accordingly, the output image data RGB', the output control signal Sync', and the output clock signal CLK' which are converted via the intermediate interface 130 may be the same as the output image data RGB', the output control signal Sync', and the output clock signal CLK' which are generated via the timing controller 111.

The output image data RGB', the output control signal Sync', and the output clock signal CLK' which are converted via the intermediate interface 130 may be provided to the driving unit 140 via the flexible printed circuit board (FPCB) FPC. The flexible printed circuit board FPC is connected to the driving unit 140 by a parallel link. In this case, a first signal data1 is transmitted to the gate driving unit 142 and a second signal data2 is transmitted to the data driving unit 141 via the flexible printed circuit board FPC.

The driving unit 140 drives the sub pixels of the display unit 160 based on the output image data RGB', the output control signal Sync', and the output clock signal CLK' received from the flexible printed circuit board FPC. The driving unit 140 includes a data driving unit 141 and a gate driving unit 142.

The gate driving unit 141 sequentially supplies an on-voltage or off-voltage gate signal Vscan to the gate lines GL according to a first signal data1 which is formed of signals such as a gate start pulse, a gate output enable signal, or a gate shift clock. The gate driving unit 142 includes a shift register and a level shifter.

The data driving unit 141 converts the output image data RGB' into an analog data signal Vdata according to a second signal data2 which is configured by the output image data RGB', the source start pulse, the source output enable signal, and the source sampling clock to output the output image data to the data lines DL. In this case, the data driving unit 142 is configured to output the data signal Vdata at a timing when the gate signal Vscan is applied to a specific gate line GL.

The data driving unit 141 includes a logic unit including various circuits such as a level shifter or a latch unit, a digital analog converter DAC, and an output buffer.

The data driving unit 141 and the gate driving unit 142 may be disposed on one printed circuit board. In this case, the printed circuit board on which the data driving unit 141 and the gate driving unit 142 are disposed may be referred to as a source board. However, the exemplary embodiment is not limited thereto and the data driving unit 141 and the gate driving unit 142 may be disposed on separate printed circuit boards.

Further, in some exemplary embodiments, at least one of the data driving unit 141 and the gate driving unit 142 may be disposed on a substrate of the display unit 160. For example, the gate driving unit 142 may be implemented as a gate in panel GIP type to be disposed directly on the substrate of the display unit 160 and the data driving unit 141 may be implemented as a chip on film COF type on the flexible printed circuit board FPC connected to the intermediate interface 130. In this case, one end of the flexible printed circuit board FPC is bonded to a source printed circuit board on which the intermediate interface 130 is disposed and the other end may be bonded onto the substrate of the display unit 160.

The display device 100 according to an exemplary embodiment of the present disclosure includes a recovery unit 120 which is disposed between the control board 110 and the driving unit 140 and is spaced apart from the control board 110 and the driving unit 140. The control board 110 and the recovery unit 120 are connected by the first output coaxial cable OCC1 and the recovery unit 120 and the intermediate interface 130 are connected by the second output coaxial cable OCC2. Therefore, when the distance between the control board 110 and the driving unit 140 is long, the output signal Vx1_out of the control board 110 may be transmitted without causing a loss of the data.

Specifically, a general display device 100 which does not include the recovery unit 120, there is a limit in long-distance transmission of the output signal Vx1_out of the control board 110. As mentioned above, in order to transmit a huge amount of data at a high speed and reduce the number of wiring lines for signal transmission, the output signal Vx1_out may be transmitted in a serial link manner. However, according to the serial link manner, the output signal Vx1_out is transmitted at a high frequency of 3 GHz or higher in order to improve a transmission speed of the signal. In this case, a noise may be generated in the cable due to ISI and jitter and the waveform of the signal which is received by the intermediate interface 130 may be modified due to the noise. In this case, some bits of data may be erroneously converted during the process of converting the output signal Vx1_out into data by the intermediate interface 130. That is, the waveform of the output signal Vx1_out is modified, so that it may be unclear whether a data value of a specific bit is 1 or 0. In this case, even though the data value of the original data is 1, the intermediate interface 130 may erroneously convert the data value into 0.

A degree of the modification of the waveform of the output signal Vx1_out due to the noise may vary depending on a length of the coaxial cable which connects the control board 110 and the intermediate interface 130. Generally, in the serial link manner which transmits a signal at a high frequency of 3 GHz or higher, when the length of the coaxial cable exceeds 2 m, a data loss due to the noise may be considerably generated and errors may be incurred at the time of converting data by the intermediate interface 130. Therefore, an image quality of the image displayed on the display unit 160 may be degraded.

In this case, the above-described noise may be reduced using a coaxial cable in which wiring lines are thick and formed of silver having a low resistance and are sufficiently spaced apart from each other so that the interference between wiring lines is minimized. However, in this case, a cost for the coaxial cable is undesirably increased. Further, even though the material for the coaxial cable is sufficiently good, there may be a technical limitation to transmit a signal to a distance of 5 m or longer.

However, the display device 100 according to the exemplary embodiment of the present disclosure includes the recovery unit 120 which is spaced apart from the control board 110 and the driving unit 140 and is configured to recover the output signal Vx1_out of the control board 110. Therefore, a transmission distance of the output signal Vx1_out may be improved. Detailed description thereof will be provided with reference to FIGS. 4A to 4D.

Figure 4A:
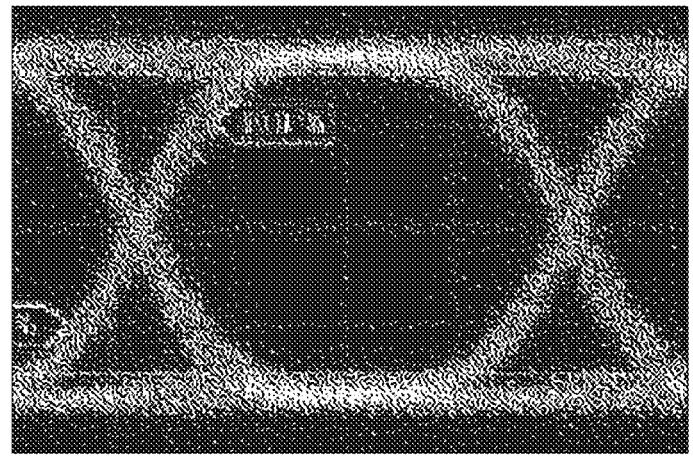
FIGS. 4A to 4D are waveform diagrams of signals of a display device according to an exemplary embodiment of the present disclosure.
Figure 4B:
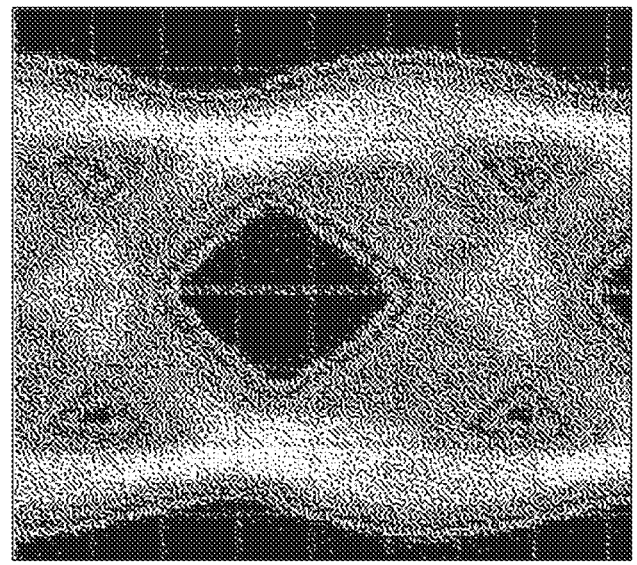
Figure 4C:
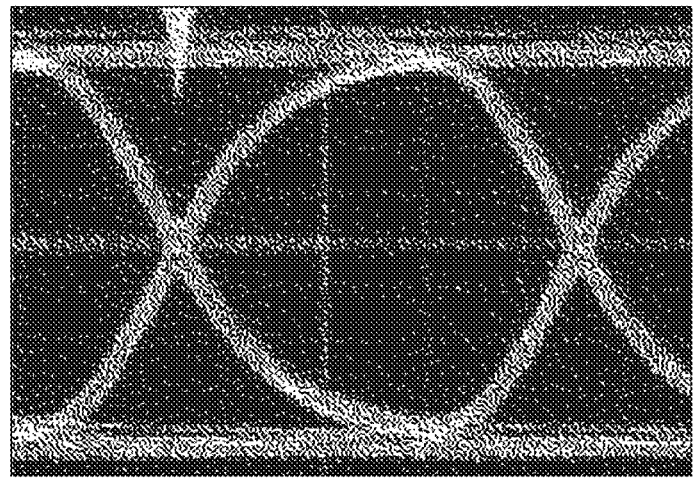
Figure 4D:
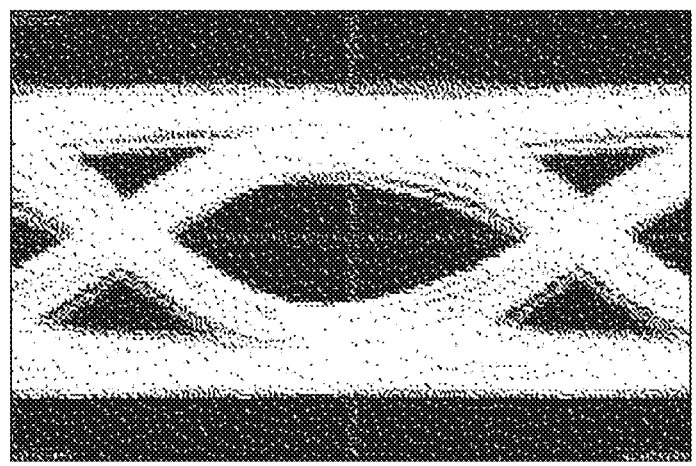

FIGS. 4A to 4D are waveform diagrams of a display device according to an exemplary embodiment of the present disclosure. Specifically, FIG. 4A is an eye pattern of an output signal Vx1_out output from the control board 110, FIG. 4B is an eye pattern of a signal which is received by the recovery unit 120. FIG. 4C is an eye pattern of a recovery signal Vx1_out' which is recovered by the recovery unit 120, and FIG. 4D is an eye pattern of the recovery signal Vx1_out' which is received by the intermediate interface 130.

Referring to FIG. 4A, it is understood that the output signal Vx1_out output through the transmitting unit 113 of the control board 110 has a clear eye pattern which precisely distinguishes the data values.

Referring to FIG. 4B, it is identified that a significant noise is generated in the output signal Vx1_out while passing through the first output coaxial cable OCC1 and an eye pattern of the output signal Vx1_out which passes through the first output coaxial cable OCC1 is substantially closed. If the output signal Vx1_out is transmitted to the intermediate interface 130 via the second output coaxial cable OCC2 without being recovered, a noise may be additionally generated by the second output coaxial cable OCC2 and the eye pattern of the output signal Vx1_out may be closed more than the eye pattern illustrated in FIG. 4B. In this case, the data which is converted by the intermediate interface 130 may have a data value which is different from the original data and an image quality of the display unit 160 may be degraded due to the data loss.

However, when the recovery unit 120 is connected to the first output coaxial cable OCC1, the output signal Vx1_out which passes through the first output coaxial cable OCC1 may be recovered.

As illustrated in FIG. 4C, it is understood that the eye pattern of the recovery signal Vx1_out' recovered by the equalizer 121 and the pre-emphasis circuit 122 of the recovery unit 120 is considerably clear.

As illustrated in FIG. 4D, the recovery signal Vx1_out output from the recovery unit 120 may be modified while passing through the second output coaxial cable OCC2. That is, the noise generated in the second output coaxial cable OCC2 may modify the recovery signal Vx1_out'. However, as illustrated in FIG. 4D, it is understood that the eye pattern of the recovery signal Vx1_out' received by the intermediate interface 130 is considerably similar to that of the output signal Vx1_out output from the control board 110. Therefore, the data converted in the intermediate interface 130 may be the same as the data output from the timing controller 112 of the control board 110 and the image of the display unit 160 may not be modified.

Since the recovery unit 120 recovers the output signal Vx1_out of the control board 110 between the control board 110 and the intermediate interface 130, so that the transmission distance of the output signal Vx1_out may be improved. Specifically, when the recovery unit 120 is not provided, the control board 110 and the intermediate interface 130 may not be spaced apart from each other more than the first length L1 of the first output coaxial cable OCC1. That is, as illustrated in FIG. 4B, the eye pattern of the output signal Vx1_out may be substantially closed due to the noise of the first output coaxial cable OCC1. When the first length L1 of the first output coaxial cable OCC1 is increased, the eye pattern of the output signal Vx1_out may be completely closed due to the noise of the first output coaxial cable OCC1. In this case, the intermediate interface 130 may erroneously recognize the data value of the output signal Vx1_out and errors of data conversion may be incurred.

However, when the recovery unit 120 is disposed between the control board 110 and the intermediate interface 130, the output signal Vx1_out of the control board 110 is recovered after passing through the first output coaxial cable OCC1. Therefore, the output signal Vx1_out may be transmitted as long as a second length L2 of the second output coaxial cable OCC2.

In this case, the first length L1 of the first output coaxial cable OCC1 and the second length L2 of the second output coaxial cable OCC2 may be determined depending on a degree of noise generation by the first output coaxial cable OCC1 and a degree of noise generation by the second output coaxial cable OCC2, respectively. Specifically, the lengths L1 and L2 of the first output coaxial cable OCC1 and the second output coaxial cable OCC2 may be selected to have appropriate lengths such that the eye pattern of the signal which passes through the first output coaxial cable OCC1 and the second output coaxial cable OCC2 is not closed more than a predetermined eye pattern. For example, the lengths L1 and L2 of the first output coaxial cable OCC1 and the second output coaxial cable OCC2 may be determined such that insertion losses IL of the first output coaxial cable OCC1 and the second output coaxial cable OCC2 are 0 to −18 dB. Here, the insertion loss refers to an insertion loss of both the first output coaxial cable OCC1 and the second output coaxial cable OCC2 and refers to not only an insertion loss of the coaxial cable, but also the entire insertion loss including an insertion loss of the connector connected to both ends of the coaxial cable. The insertion loss may be defined by the following Equation 1.

$$IL = 10 \log \frac{P_{out}}{P_{in}} \quad \text{[Equation 1]}$$

Here, $P_{out}$ refers to an output level of a signal which passes through the first output coaxial cable OCC1 and the second output coaxial cable OCC2 and $P_{in}$ refers to an output level of a signal before passing through the first output coaxial cable OCC1 and the second output coaxial cable OCC2. The insertion loss IL of the first output coaxial cable OCC1 and the second output coaxial cable OCC2 is proportional to the lengths L1 and L2 of the first output coaxial cable OCC1 and the second output coaxial cable OCC2 and is inversely proportional to resistances of the first output coaxial cable OCC1 and the second output coaxial cable OCC2. Therefore, when the resistances of the first output coaxial cable OCC1 and the second output coaxial cable OCC2 are low, the lengths L1 and L2 of the first output coaxial cable OCC1 and the second output coaxial cable OCC2 may be configured to be long. When the resistances of the first output coaxial cable OCC1 and the second output coaxial cable OCC2 are high, the lengths L1 and L2 of the first output coaxial cable OCC1 and the second output coaxial cable OCC2 may be configured to be short.

When the insertion loss IL of the first output coaxial cable OCC1 and a second output coaxial cable OCC2 is lower than −18 dB, the eye pattern of the signal which passes through the first output coaxial cable OCC1 and the second output coaxial cable OCC2 may be closed more than the predetermined reference eye pattern. In this case, errors may be incurred during a process of converting the data from a signal which passes through the first output coaxial cable OCC1 and the second output coaxial cable OCC2.

Specifically, when the first length L1 of the first output coaxial cable OCC1 is long so that the insertion loss IL of the first output coaxial cable OCC1 is lower than −18 dB, the recovered signal Vx1_out' recovered in the recovery unit 120 may include data which is different from the output signal Vx1_out output from the control board 110. Specifically, when the insertion loss IL of the first output coaxial cable OCC1 is lower than −18 dB, the eye pattern of the output signal Vx1_out which is transmitted to the recovery unit 120 may be closed more than the reference eye pattern. As mentioned above, the equalizer 121 of the recovery unit 120 applies a filter to the output signal Vx1_out to filter the noise component and applies a predetermined current to the modified output to correct a signal waveform. When the eye pattern of the output signal Vx1_out is closed more than the reference eye pattern, a level of a noise component of the output signal Vx1_out may be similar to a level of a data component of the output signal Vx1_out and the noise component may not be filtered through the filter of the equalizer 121. In this case, the equalizer 121 applies a predetermined current to the noise component of the output signal Vx1_out to amplify the noise component and the noise component may be erroneously recognized as a data component in the intermediate interface 130.

Accordingly, the lengths L1 and L2 of the first output coaxial cable OCC1 and the second output coaxial cable OCC2 may be determined such that insertion losses IL of the first output coaxial cable OCC1 and the second output coaxial cable OCC2 are −18 dB or higher, that is, 0 to −18 dB.

Figure 5:
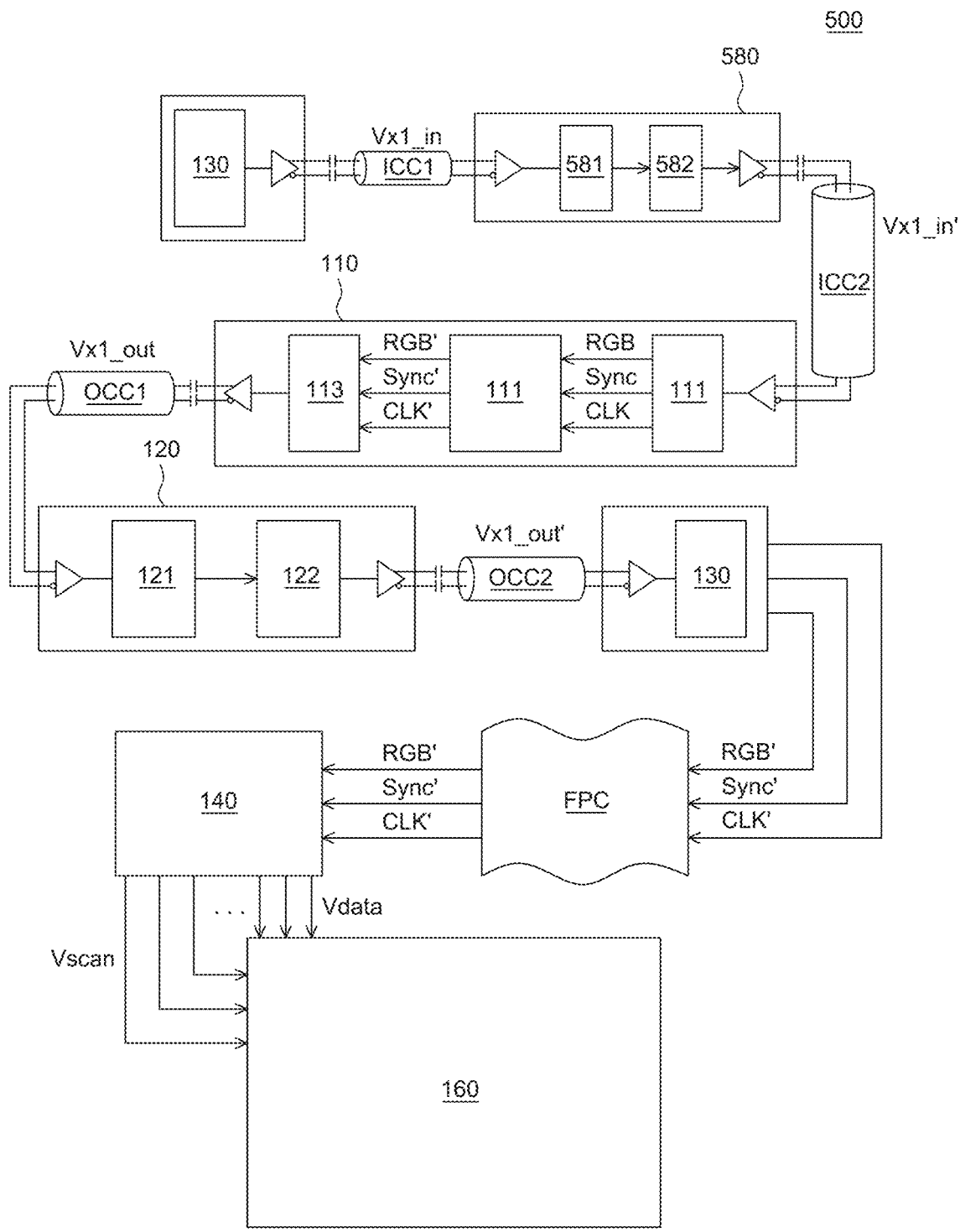
FIG. 5 is a schematic block diagram for explaining a display device according to another exemplary embodiment of the present disclosure.

FIG. 5 is a schematic block diagram for explaining a display device according to another exemplary embodiment of the present disclosure. A display device 500 according to another exemplary embodiment of the present disclosure is the same as the display device 100 according to the exemplary embodiment of the present disclosure illustrated in FIGS. 1 and 2, except that an input recovery unit 580 is further inserted between the system board 10 and the control board 110. Therefore, a redundant description will be omitted.

Referring to FIG. 5, the input recovery unit 580 is spaced apart from the system board 10 and the control board 110 to be formed on a separate printed circuit board. The input recovery unit 580 includes an input equalizer 581 and an input pre-emphasis circuit 582.

The input equalizer 581 and the input pre-emphasis circuit 582 of the input recovery unit 580 are the same as the equalizer 121 and the pre-emphasis circuit 122 of the recovery unit 120. That is, the input equalizer 581 removes a noise component which is generated when the input signal Vx1_in transmitted via the first output coaxial cable OCC1 passes through the first output coaxial cable OCC1 and recovers the signal level for the bits having a degraded signal level for the signal from which the noise is removed.

The input pre-emphasis circuit 582 predicts that the waveform of the input recovery signal Vx1_in' is modified via the second input coaxial cable ICC2 to adjust a signal level corresponding to a specific bit of the input recovery signal Vx1_in'.

The first input coaxial cable ICC1 connects the input recovery unit 580 and the system board 10 to each other and the second input coaxial cable ICC2 connects the input recovery unit 580 and the control board 110 to each other. As mentioned above, the system board 10 and the control board 110 transmit/receive the input signal Vx1_in through a serial link interface. Specifically, the system board 10 converts the input image data, the input control signal, and the input clock signal into a serial signal by a V-by-One interface to transmit the input signal Vx1_in.

In the meantime, as illustrated in FIG. 5, the system board 10 may be located in the display device 500 as a component of the display device 500 or may be separated from the display device 500 to be configured as a separate device. For example, the system board 10 may be located in a graphic card or an image receiving device which provides image data to the display device 500.

In this case, lengths of a first input coaxial cable ICC1 and a second input coaxial cable ICC2 may be determined by an insertion loss of the first input coaxial cable ICC1 and the second input coaxial cable ICC2. For example, the lengths of the first input coaxial cable ICC1 and the second input coaxial cable ICC2 may be determined such that the insertion losses of the first input coaxial cable ICC1 and the second input coaxial cable ICC2 are 0 to −18 dB. Here, the insertion loss refers to an insertion loss of both the first input coaxial cable ICC1 and the second input coaxial cable ICC2 and refers to not only an insertion loss of the coaxial cable itself, but also the entire insertion loss including an insertion loss of the connector connected to both ends of the coaxial cable.

The display device 500 according to another exemplary embodiment of the present disclosure includes an input recovery unit 580 configured to be inserted between the system board 10 and the control board 110 to recover the input signal Vx1_in. Therefore, the system board 10 and the control board 110 may be spaced apart from each other by a long distance. Even though the input signal Vx1_in transmitted from the system board 10 is transmitted over a long distance, the modification of the waveform of the input signal Vx1_in may be minimized. Therefore, the modification of the input image data due to the modification of the waveform of the input signal Vx1_in is suppressed and the modification of the image of the display device 500 may be minimized.

Figure 6:
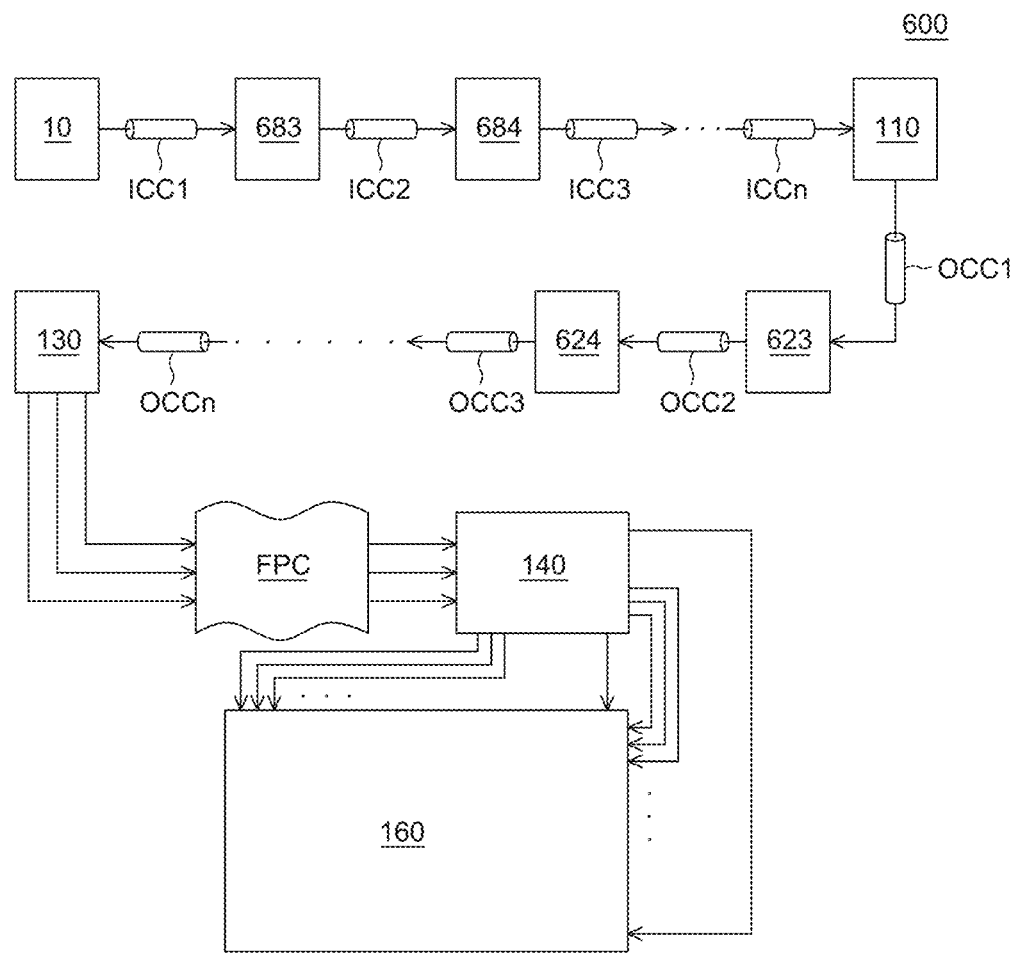
FIG. 6 is a schematic block diagram for explaining a display device according to still another exemplary embodiment of the present disclosure.

FIG. 6 is a schematic block diagram for explaining a display device according to still another exemplary embodiment of the present disclosure. A display device 600 according to another exemplary embodiment of the present disclosure is the same as the display device 500 illustrated in FIG. 5 except that the display device 600 includes a plurality of input recovery units 683 and 684 disposed between the system board and the control board 110 and a plurality of output recovery units 623 and 624 disposed between the control board 110 and the intermediate interface 130. Therefore, a redundant description will be omitted.

Referring to FIG. 6, the system board 10 and the control board 110 may be spaced apart from each other by a long distance and a plurality of input recovery units 683 and 684 configured to recover the input signal between the system board 10 and the control board 110 may be disposed. In this case, a group of the plurality of input recovery units 683 and 684 may be referred to as an input recovery unit and the plurality of input recovery units 683 and 684 may be referred to as sub input recovery units which configure the input recovery unit.

The input recovery units 683 and 684 may be connected to a plurality of input coaxial cables ICC1, ICC2, ICC3, ICCn. For example, the first input recovery unit 683 and the system board 10 are connected by the first input coaxial cable ICC1, the second input recovery unit 684 and the first input recovery unit 683 are connected by the second input coaxial cable ICC2, and the third input recovery unit and the second input recovery unit 684 are connected by the third input coaxial cable ICC3. Similarly, the third input recovery unit to the n−1-th input recovery unit may be connected by the fourth to n−1-th input coaxial cables, respectively and the n−1-th input recovery unit and the control board 110 may be connected by a n-th input coaxial cable ICCn.

Further, the control board 110 and the intermediate interface 130 may be spaced apart from each other by a long distance and a plurality of recovery units 623 and 624 which is configured to recover the output signal between the control board 110 and the intermediate interface 130 may be disposed. In this case, a group of the plurality of recovery units 623 and 624 may be referred to as a recovery unit and the plurality of recovery units 623 and 624 may be referred to as sub recovery units which configure the recovery unit.

The recovery units 623 and 624 may be connected to a plurality of output coaxial cables OCC1, OCC2, OCC3, OCCn. For example, the first recovery unit 623 and the control board 110 are connected by the first output coaxial cable OCC1, the second recovery unit 624 and the first recovery unit 623 are connected by the second output coaxial cable OCC2, and the third recovery unit and the second recovery unit 624 are connected by the third output coaxial cable OCC3. Similarly, the third recovery unit to the n−1-th recovery unit may be connected by the fourth to n−1-th output coaxial cables, respectively and the n−1-th recovery unit and the intermediate interface 130 may be connected by a n-th output coaxial cable OCCn.

The display device 600 according to another exemplary embodiment of the present disclosure may freely separate the distance between the system board 10 and the control board 110 using the plurality of input recovery units 683 and 684 and the plurality of recovery units 623 and 624 and freely separate the distance between the control board 110 and the intermediate interface 130. That is, the input signal output from the system board 10 may be recovered at a plurality of intermediate points by the plurality of input recovery units 683 and 684 so that a transmission distance of the input signal may be increased according to the number of inserted input recovery units 683 and 684. Further, the output signal output from the control board 110 may be recovered at a plurality of intermediate points by the plurality of recovery units 623 and 624 so that a transmission distance of the output signal may be increased according to the number of inserted recovery units 623 and 624. Accordingly, the degree of freedom of design of the display device 600 is improved and the loss of the image data may be minimized even in a large-size display device 600 in which the distance between the driving unit 140 and the control board 110 is long.

Figure 7:
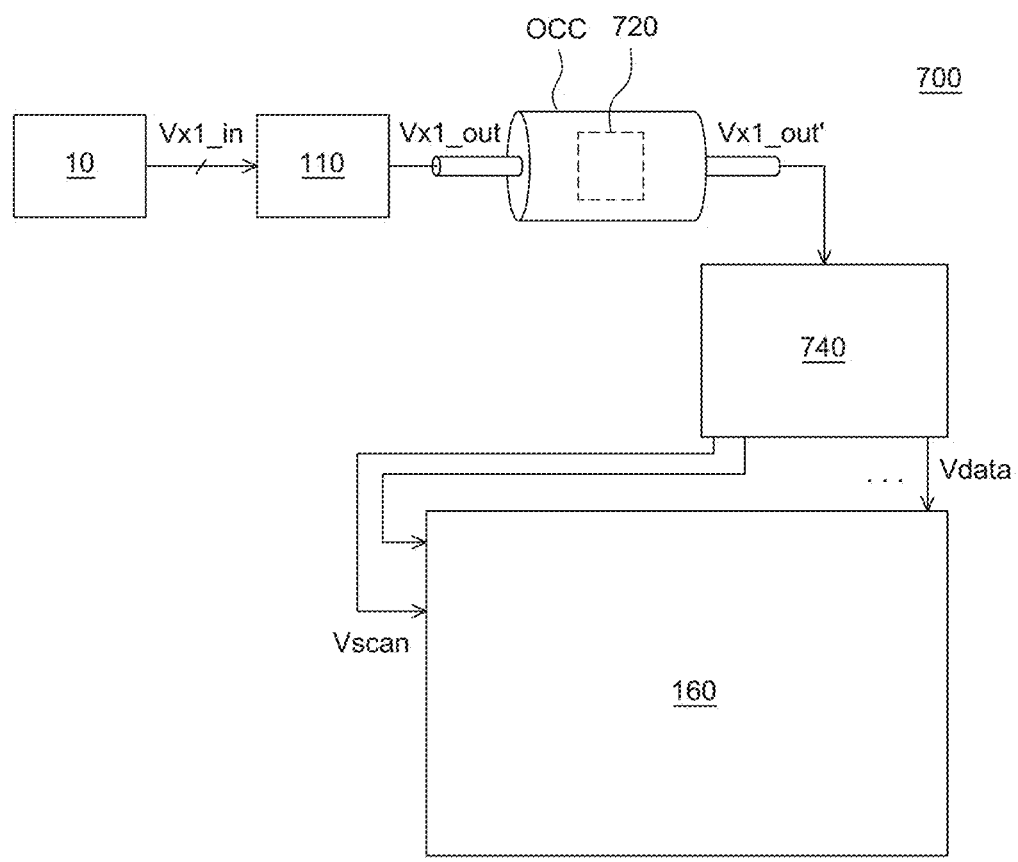
FIG. 7 is a schematic block diagram for explaining a display device according to still another exemplary embodiment of the present disclosure.

FIG. 7 is a schematic block diagram for explaining a display device according to still another exemplary embodiment of the present disclosure. A display device 700 according to another exemplary embodiment of the present disclosure is the same as the display device 100 illustrated in FIGS. 1 and 2 except that a recovery unit 720 is embedded in a cable assembly OCCa and an intermediate interface and a driving unit are formed on one printed circuit board to configure a source board 740. Therefore, a redundant description those of will be omitted.

The intermediate interface and the driving unit may be disposed on one printed circuit board. In this case, the printed circuit board including the intermediate interface and the driving unit may be referred to as a source board 740. The source board 740 converts a recovery signal Vx1_out' received from the cable assembly OCCa in which the recovery unit 720 is embedded into a parallel signal and generates a data signal Vdata and a gate signal Vscan for driving pixels of the display unit 160 to output the data signal and the gate signal to the display unit 160.

In the meantime, the recovery unit 720 which recovers the output signal Vx1_out output from the control board 110 may be configured to be embedded in the cable assembly OCCa which connects the control board 110 and the source board 740. In this case, the cable assembly OCCa recovers the output signal Vx1_out between the control board 110 and the source board 740 to generate the recovery signal Vx out'. The cable assembly OCCa may be configured to be longer than the output coaxial cable. Specifically, the length of the cable assembly OCCa may be configured such that an insertion loss of the cable assembly OCCa is 0 to −36 dB. The recovery unit 720 may be appropriately disposed such that an eye pattern of the output signal Vx1_out which passes through the cable assembly OCCa is not closed more than a predetermined reference eye pattern. For example, the position of the recovery unit 720 may be determined such that an insertion loss of a first part of the cable assembly OCCa located at a front end of the recovery unit 720 is 0 to −18 dB. In this case, modification of the output signal Vx1_out which is generated while passing through the first part of the cable assembly OCCa is recovered by the recovery unit 720 and the recovery signal Vx1_out' output through the recovery unit 720 may be transmitted to the source board 740 via a second part of the cable assembly OCCa.

The display device 700 according to another exemplary embodiment of the present disclosure includes a source board including an intermediate interface and a driving unit and a cable assembly OCCa with an embedded recovery unit 720. Therefore, a structure of the display device 700 may be simplified and a manufacturing cost of the display device 700 may be saved.

The exemplary embodiments of the present disclosure can also be described as follows:

According to an exemplary embodiment of the present disclosure, a display device includes a display unit, a driving unit, a control board, and at least one recovery unit. The display unit includes a plurality of pixels. The driving unit provides a driving signal to the display unit. The control board is spaced apart from the driving unit and outputs the output signal in a serial link manner. At least one recovery unit is located between the driving unit and the control board and spaced apart from the driving unit and control board, and is configured to recover the output signal. The display device according to the exemplary embodiment of the present disclosure recovers the output signal of the control board between the control board and the driving unit using at least one recovery unit. Therefore, it is possible to transmit the output signal of the control board over a long distance and transmit the output signal of the control board without having a loss of data even though the distance between the control board and the driving unit is long.

The control board may include: a timing controller which generates output image data for the plurality of pixels and an output control signal for the driving unit; and a transmitting unit which converts the output image data and the output control signal into the output signal using a current mode logic CML.

The transmitting unit outputs the output signal using a V-by-One interface.

The display device may further include: a first output coaxial cable connecting the control board and the recovery unit; a second coaxial cable connected to the recovery unit; and an intermediate interface which is spaced apart from the recovery unit and is connected to the recovery unit through the second output coaxial cable.

The display device may further include a flexible printed circuit board which connects the intermediate interface and the driving unit.

The display device may further include a source board on which the intermediate interface and the driving unit are disposed; and a flexible printed circuit board which connects the source board and the display unit.

A display device may further include a system board, an input recovery unit, a first input coaxial cable, and a second input coaxial cable. The system board may be spaced apart from the control board and may output the input signal in a serial link manner. The input recovery unit may be disposed between the system board and the control board and be spaced apart from the system board and the control board and be configured to recovery the input signal. The first input coaxial cable may connect the system board and the input recovery unit. The second input coaxial cable may connect the input recovery unit and the control board.

Each of the input recovery unit and the recovery unit may include a plurality of sub recovery units, and the plurality of sub recovery units may be connected to each other by a plurality of sub coaxial cable.

Insertion losses of the first input coaxial cable, the second input coaxial cable, the first output coaxial cable, the second output coaxial cable, and the plurality of sub coaxial cables may be 0 to −18 dB.

Each of the input recovery unit and the recovery unit may include an equalizer and a pre-emphasis circuit.

According to another exemplary embodiment of the present disclosure, a display device includes a display unit, a source board, a control board, and a cable assembly. The display unit includes a plurality of pixels. The source board provides a driving signal to the display unit. The control board is spaced apart from the source board and outputs the output signal in a serial link manner. The cable assembly may be configured to connect the source board and the control board, recover the output signal between the source board and the control board to generate a recovery signal, and transmit the recovery signal to the source board.

The cable assembly may equalize and pre-emphasize the output signal to generate the recovery signal.

The source board may include a driving unit which drives the plurality of pixels and an intermediate interface which receives the output signal, and the control board may include a timing controller which generates output image data for the plurality of pixels and an output control signal for the driving unit and a transmitting unit which converts the output image data and the output driving signal into an output signal using a current mode logic CML.

An insertion loss of the cable assembly may be 0 to −36 dB.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
   a display unit including a plurality of pixels;
   a driving unit configured to provide a driving signal to the display unit;
   a control board which is spaced apart from the driving unit and is configured to output an output signal in a serial link manner;
   at least one recovery unit which is located between the driving unit and the control board, is spaced apart from the driving unit and the control board, and is configured to recover the output signal received from the control board,
   wherein the recovery unit includes:
      an equalizer configured to remove a noise component generated in the output signal during transmission to the recovery unit and configured to recover a signal level of the output signal received from the control board from which the noise component has been removed to provide an equalized signal, and
      a pre-emphasis circuit configured to modify a waveform of the equalized signal by adjusting a specific bit of the equalized signal to output a recovered output signal;
   a first coaxial cable connected between the recovery unit and the control board; and
   a second coaxial cable connected between the recovery unit and the driving unit.

2. The display device according to claim 1, wherein the control board includes:
   a timing controller configured to output image data for the plurality of pixels and an output control signal for the driving unit; and
   a transmitting unit configured to convert the output image data and the output control signal into the output signal using a current mode logic CML.

3. The display device according to claim 2, wherein the transmitting unit is configured to output the output signal using a V-by-One interface.

4. The display device according to claim 1, further comprising:
   an intermediate interface which is spaced apart from the recovery unit and is connected to the recovery unit through the second coaxial cable.

5. The display device according to claim 4, further comprising:
   a flexible printed circuit board which connects the intermediate interface and the driving unit.

6. The display device according to claim 4, further comprising:
   a source board on which the intermediate interface and the driving unit are disposed; and
   a flexible printed circuit board connecting the source board and the display unit.

7. The display device according to claim 4, further comprising:
   a system board which is spaced apart from the control board and is configured to output an input signal in the serial link manner;
   an input recovery unit which is disposed between the system board and the control board and is spaced apart from the system board and the control board, and is configured to recover the input signal;
   a first input coaxial cable which connects the system board and the input recovery unit; and
   a second input coaxial cable which connects the input recovery unit and the control board.

8. The display device according to claim 7, wherein each of the input recovery unit and the recovery unit includes a plurality of sub recovery units, and the plurality of sub recovery units is connected to each other by a plurality of sub coaxial cables.

9. The display device according to claim 8, wherein insertion losses of the first input coaxial cable, the second input coaxial cable, the first coaxial cable, the second coaxial cable, and the plurality of sub coaxial cables are 0 to −18 dB.

10. The display device according to claim 7, wherein the input recovery unit includes an equalizer and a pre-emphasis circuit.

11. A display device, comprising:
    a display unit including a plurality of pixels;
    a source board configured to provide a driving signal to the display unit;
    a control board which is spaced apart from the source board and is configured to output an output signal in a serial link manner; and
    a cable assembly configured to connect the source board and the control board to each other, recover the output signal between the source board and the control board to generate a recovery signal, and transmit the recovery signal to the source board,
    wherein the cable assembly includes a recovery unit embedded therein, the recovery unit being configured to recover the output signal received from the control board, and
    wherein the recovery unit includes:
       an equalizer configured to remove a noise component generated in the output signal during transmission to the recovery unit and configured to recover a signal level of the output signal received from the control board from which the noise component has been removed to provide an equalized signal, and
       a pre-emphasis circuit configured to modify a waveform of the equalized signal by adjusting a specific bit of the equalized signal to output the recovery signal;
    wherein the cable assembly further includes a first coaxial cable connected between the recovery unit and the control board, and a second coaxial cable connected between the recovery unit and the source board.

12. The display device according to claim 11, wherein the cable assembly is configured to equalize and pre-emphasize the output signal to generate the recovery signal.

13. The display device according to claim 11, wherein the source board includes a driving unit configured to drive the plurality of pixels, and an intermediate interface configured to receive the output signal, and
    the control board includes a timing controller configured to generate output image data for the plurality of pixels and an output control signal for the driving unit, and a transmitting unit configured to convert the output image data and the output driving signal into an output signal using a current mode logic CML.

14. The display device according to claim 11, wherein an insertion loss of the cable assembly is 0 to −36 dB.

* * * * *